United States Patent [19]
Kim et al.

[11] Patent Number: 5,840,120
[45] Date of Patent: Nov. 24, 1998

[54] APPARATUS FOR CONTROLLING NUCLEATION OF OXYGEN PRECIPITATES IN SILICON CRYSTALS

[75] Inventors: Kyong-Min Kim, St. Charles; Roger W. Shaw, Kirkwood; Sadasivam Chandrasekhar; Richard G. Schrenker, both of Chesterfield, all of Mo.

[73] Assignee: MEMC Electronic Materials, Inc., St. Peters, Mo.

[21] Appl. No.: 589,612

[22] Filed: Jan. 22, 1996

[51] Int. Cl.⁶ .................................................. C30B 35/00
[52] U.S. Cl. ......................... 117/208; 117/217; 117/218; 117/900
[58] Field of Search ............................ 117/20, 200, 208, 117/213, 217, 218, 222, 900

[56] References Cited

U.S. PATENT DOCUMENTS

| | | |
|---|---|---|
| 4,956,153 | 9/1990 | Yamagishi et al. . |
| 5,248,378 | 9/1993 | Oda et al. . |
| 5,316,742 | 5/1994 | Tomioka et al. ......................... 117/217 |
| 5,524,574 | 6/1996 | Huang et al. .............................. 117/20 |

FOREIGN PATENT DOCUMENTS

| | | |
|---|---|---|
| 0 716 168 | 6/1996 | European Pat. Off. . |
| 3-177391 | 3/1991 | Japan . |
| 404321580 A | 3/1992 | Japan ..................................... 117/217 |
| 405024979 A | 2/1993 | Japan ..................................... 117/217 |
| 8-119786 | 8/1996 | Japan . |

OTHER PUBLICATIONS

W. Bienert et al. "Performance Characteristics of Isothermal Furnace Liners" dynaTherm Corporation (Sep. 1984) 10 pages.
dynaTherm brochure "Isothermal Furnace Liner" Catalog No. IFL 84 (no date) 2 pages.
Thermacore brochure "Common Questions About Heat Pipes" (no date) 2 pages.

*Primary Examiner*—Felisa Garrett
*Attorney, Agent, or Firm*—Senniger, Powers, Leavitt & Roedel

[57] ABSTRACT

An apparatus for producing a silicon single crystal grown by the Czochralski process. The apparatus includes a hollow growth chamber, a quartz crucible disposed within the growth chamber, and a pulling member for pulling a growing silicon single crystal upward from a silicon melt retained in the crucible. A crystal chamber above the growth chamber receives the crystal as it is pulled. A joining member joins the growth chamber and the crystal chamber. A first heating member defining a passageway through which the crystal is pulled, for preventing formation of oxygen precipitate nucleation centers in the crystal until the crystal has been pulled through the passageway, is disposed at least partially within the growth chamber. A second heating member defining a passageway through which the crystal is pulled, for controlling the formation of the oxygen precipitate nucleation centers in the crystal, is disposed within the crystal chamber.

17 Claims, 3 Drawing Sheets

APPARATUS FOR CONTROLLING NUCLEATION OF OXYGEN PRECIPITATES IN SILICON CRYSTALS

BACKGROUND OF THE INVENTION

The present invention relates generally to the preparation of silicon crystals grown by the Czochralski process. The invention particularly relates to an apparatus and method for controlling the formation of oxygen precipitate nucleation centers in a crystal as it is grown.

Single crystal silicon, which is used in fabricating semiconductor electronic components, is typically prepared by the Czochralski (Cz) process wherein a single crystal seed is immersed into molten silicon within a silica crucible and then grown by slow extraction. The surface of the silica ($SiO_2$) crucible which is in contact with the melt dissolves, releasing oxygen into the melt. Oxygen concentration in the crystal is determined by oxygen concentration in the melt at the crystal-melt interface and the segregation coefficient of oxygen in solidifying silicon. As the crystal grows from the melt and cools, the solubility of oxygen in the crystal decreases rapidly such that oxygen is present in supersaturated concentrations in the cooled as-grown crystal. When the crystal is cooled to a temperature below about 750° C., the oxygen clusters within the crystal to form nucleation centers which serve as sites for the growth of oxygen precipitates. Nucleation and growth of such clusters occurs at temperatures between about 750° C. and about 400° C. Below 400° C. nucleation centers generally do not form.

The thermal history of a crystal is a function of its position with respect to the seed end of the crystal. As a crystal is grown, the seed-end is cooled to temperatures below 750° C. during the growth of the remainder of the crystal. The mid-section and opposite end section of the crystal are at temperatures above 750° C. when the end cone of the crystal disengages from the melt. At the end of the crystal growth process, the power is turned off and the crystal is jogged up to the crystal chamber. Thus the mid-section and opposite end section of the crystal cool through the 750° C. region to room temperature at a faster rate than the seed-end of the crystal. Wafers from various sections along the length of a crystal, therefore, will vary in the size and density distribution of oxygen precipitation and nucleation centers.

When the crystal is sliced into wafers and processed for fabricating electronic devices, the wafers are subjected to various thermal treatment cycles which cause precipitation of oxygen at the nucleation centers. The oxygen precipitates can be harmful or beneficial, depending upon their location in a wafer. Oxygen precipitates located in the bulk of the wafer are capable of capturing undesired metal impurities below the wafer surface (i.e., internal gettering) so that the impurities do not come into contact with the active device region during fabrication of the electronic component and compromise the component's performance. Oxygen precipitates on or very near the surface of the wafer, or oxidation-induced stacking faults formed by large oxygen precipitates in the electronically active areas near the surface can cause device failures. Oxygen precipitates at the wafer surface are prevented by dissolution and out-diffusion during device fabrication.

Because of the problems associated with oxygen precipitates in the active device region, electronic device fabricators must use silicon wafers which are incapable of forming oxygen precipitates anywhere in the wafer under their process conditions, or alternatively, wafers which only form oxygen precipitates in the bulk of the wafer and not in the device region under their process conditions. Many electronic device fabricators prefer the latter alternative in view of the benefits of internal gettering. Silicon wafers having a uniform and reproducible number density of oxygen precipitates in the bulk region are preferred. Accordingly, the formation of nucleation centers for oxygen precipitates is an important factor for product quality which must be carefully controlled as the crystal is grown.

U.S. Pat. No. 5,248,378 describes the use of a heater within the growth chamber in order to grow a crystal having a greater residence time in the temperature range above 1150° C. to reduce defects and improve the oxide film dielectric breakdown strength. This method requires complex modification of the growth chamber to install a sizable heater and electrical leads. The heater and electrical leads can also be a source of contamination within the system.

U.S. Pat. No. 4,956,153 describes a crystal growing apparatus which includes a cylindrical graphite tube through which a silicon crystal is pulled. The tube extends from the top of the growth chamber and tapers toward the crystal to an end above the surface of the melt. The tube is heated to a temperature of 750° to 850° C. by heat transferred from the melt which reduces the cooling rate of the crystal, thereby minimizing formation of oxygen induced stacking faults.

SUMMARY OF THE INVENTION

Among the objects of the invention, therefore, may be noted the provision of a process for controlling the distribution and concentration of oxygen precipitate nucleation centers in as-grown silicon single crystals; the provision of such a process for uniformly distributing nucleation centers along the length of the single crystal, the provision of such a process for controlling the formation of oxygen precipitate nucleation centers in silicon single crystals; the provision of a process for preparing a silicon single crystal lacking oxygen precipitate nucleation centers which yields silicon wafers essentially devoid of oxygen precipitates; the provision of a process for preparing a silicon single crystal having a more uniform thermal history and oxygen precipitate nucleation center density which yields wafers having a peak oxygen defect density in a region of the wafer which is relatively remote from the active region of the wafer to achieve a good internal gettering.

The present invention is directed to an apparatus for producing a silicon single crystal grown by the Czochralski process. The apparatus includes a hollow growth chamber, a quartz crucible disposed within the growth chamber, and a pulling member for pulling a growing silicon single crystal upward from a silicon melt retained in the crucible. A crystal chamber above the growth chamber receives the crystal as it is pulled. A joining member joins the growth chamber and the crystal chamber. A first heating member defining a passageway through which the crystal is pulled, for preventing formation of oxygen precipitate nucleation centers in the crystal until the crystal has been pulled through the passageway, is disposed at least partially within the growth chamber. A second heating member defining a passageway through which the crystal is pulled, for controlling the formation of the oxygen precipitate nucleation centers in the crystal, is disposed within the crystal chamber.

The present invention is also directed to a method for controlling the formation of oxygen precipitate nucleation centers in a silicon single crystal grown by the Czochralski process. The silicon single crystal is pulled from a pool of molten silicon within a growth chamber. The molten silicon is deposited at a growing end of the crystal such that the deposited silicon solidifies at an interface between the crystal and the pool. The silicon crystal is heated to maintain it at a temperature of at least about 750° C. within the growth chamber in order to prevent formation of oxygen precipitate nucleation centers in the crystal. The silicon crystal is then heated at a temperature of at least about 400° C. in a crystal chamber located above the growth chamber in order to control the formation of the oxygen precipitate nucleation centers in the crystal.

Other objects and advantages of the invention will be apparent from the following detailed description.

DETAILED DESCRIPTION OF THE PREFERRED EMBODIMENTS

In accordance with the present invention, it has been discovered that nucleation centers for oxygen precipitates are uniformly distributed within silicon single crystals by controlling the dwell time of the as-grown crystal at temperatures between about 400° C. and about 750° C., particularly between about 420° C. and about 650° C. It has also been found that oxygen precipitate nucleation centers are eliminated by maintaining the as-grown crystal at temperatures above about 750° C. and then quenching the crystal to rapidly cool it to a temperature below about 400° C. Such methods minimize the dwell time of as-grown crystals at temperatures at which oxygen within the crystal clusters to form nucleation centers at which oxygen precipitates during thermal processing.

Figure 1:
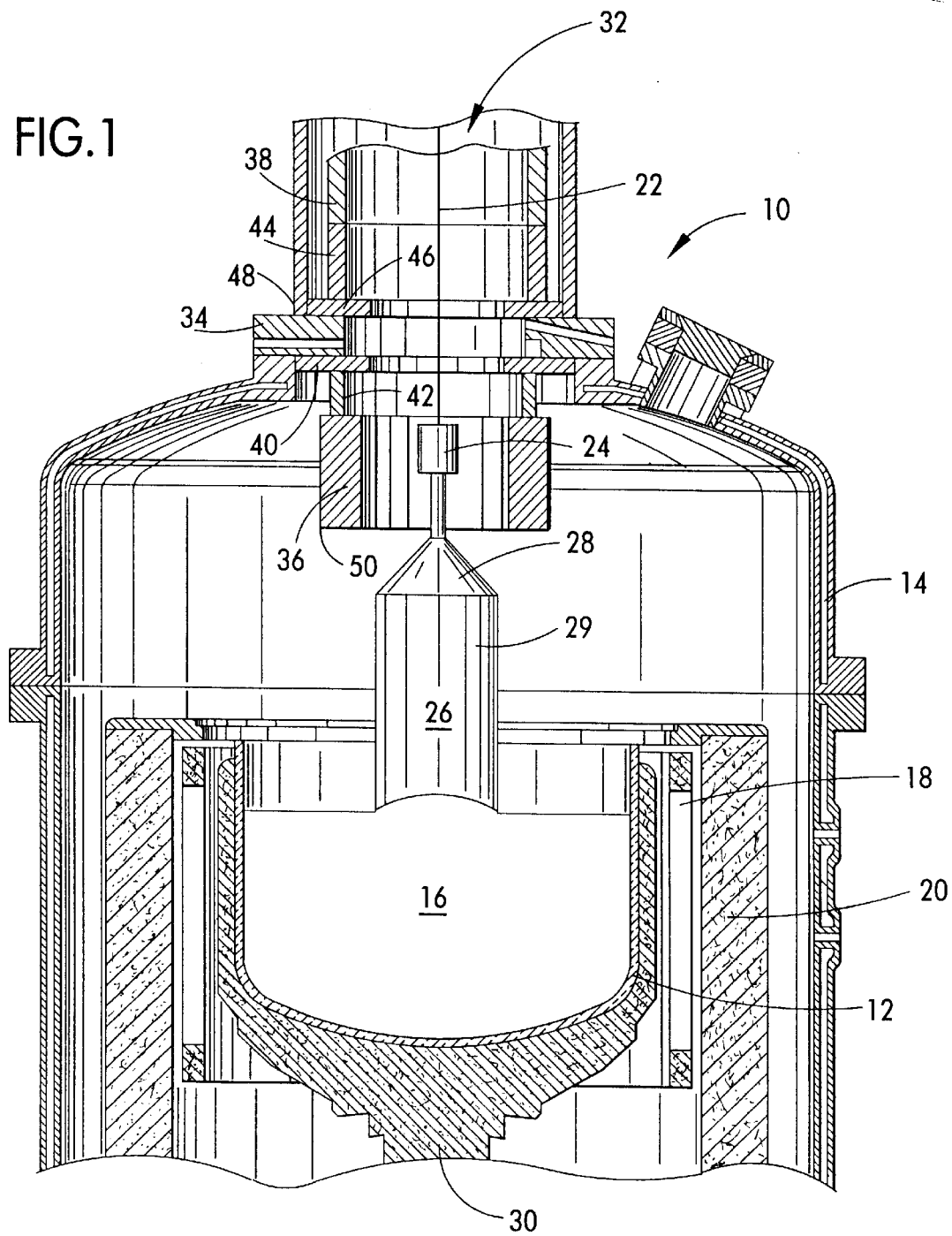
FIGS. 1 and 2 are vertical sections illustrating the internal construction of a crystal pulling apparatus embodying the present invention for producing a Czochralski-grown silicon single crystal having uniformly distributed oxygen precipitate nucleation centers or lacking oxygen precipitate nucleation centers.

Turning now to FIG. 1, there is shown a crystal pulling apparatus 10 for producing silicon single crystal ingots by the Czochralski method. The crystal pulling apparatus 10 includes a fused silica crucible 12 contained within a water-cooled stainless steel growth chamber 14. The crucible 12 holds a polycrystalline silicon melt 16. The silicon melt is provided by adding solid polycrystalline silicon (not shown) to the crucible 12. The solid silicon is melted by heat provided from a heater 18 which surrounds the crucible 12. The heater 18 is surrounded by insulation 20 to retain the heat within the crucible.

A crystal pulling shaft or wire 22 supporting a monocrystalline silicon seed 24 at its lower end is positioned above the silicon melt 16. As the seed crystal is lowered into the molten silicon 16, the seed begins to melt. After thermal equilibration, the pulling wire 22 is then retracted withdrawing the seed 24 from the molten silicon 16. As the seed 24 is withdrawn the liquid silicon from the melt freezes around the seed in a single crystal above the melt 16. The pulling wire 22 from which the formed single crystal is suspended is continuously retracted from the melt as it rotates, forming a substantially cylindrical crystal 26 as in a conventional Cz process. After a section of the crystal 26 is formed, the pull rate is decreased creating a tapered region known as the taper 28 of the crystal. When the desired diameter is obtained, the pull rate is maintained to provide a substantially continuous diameter between the seed end 29 and the tail end (not shown) of the crystal 26.

While the single crystal 26 is being pulled, the crucible 12 is rotated via a shaft 30 in a direction opposite that of the crystal 26. As the crystal grows, the crucible 12 is raised within the growth chamber 14 to compensate for depletion of the silicon melt 16.

The as-grown crystal withdrawn from the melt is retracted by the pulling wire 22 into a crystal chamber 32 above the growth chamber 14. A gate valve 34 joining the growth chamber 14 and the crystal chamber 32 is open during the crystal growth process. When the melt is nearly depleted, the pull rate and heater power are increased to produce the tapered tail end of the crystal. The single crystal ingot is then removed from the crystal chamber 32 and processed to form silicon wafers. The crystal pulling apparatus 10 as described thus far is conventional in the art.

A conventional Czochralski crystal pulling apparatus can easily be modified for purposes of the present invention by introducing a first heating member 36 into the growth chamber 14 and a second heating member 38 into the crystal chamber 32 before the crystal growth process is initiated, as shown in FIG. 1. As the crystal is pulled from the silicon melt 16, molten silicon deposits at the growing end of the crystal (i.e., the portion of the crystal at the crystal/silicon melt interface) such that the deposited silicon solidifies at the interface. The crystal is continuously transported through the passageway of the first heating member 36 such that each portion of the grown crystal is heat treated. For example, a solidified silicon segment of the crystal is maintained at a desired temperature until it has been pulled through the passageway of the first heating member as the crystal is retracted by the pulling wire 22. The heated segment of the crystal cools further after being raised above the first heating member, and is heated as it is pulled through the passageway of the second heating member. The solidified segment of the crystal beneath the heated segment is then heated in the first heating member. The entire length of the as-grown crystal extending between the opposing seed and tail ends passes through the first heating member. The same procedure is followed with respect to the passage of the crystal through the passageway of the second heating member. However, in some instances crystal pulling is stopped and the entire crystal is maintained within the passageway of the second heating member for a desired dwell time as described in detail below.

In a preferred embodiment of the invention illustrated in FIG. 1, the first heating member 36 is a heat pipe which is introduced into the growth chamber 14 by suspending it from a refractory metal plate 40 extending from the gate valve 34. Connectors 42, such as graphite rods, attach the heat pipe to the plate 40. The heat pipe is located at a particular position within the growth chamber by using connectors of the appropriate length to support the heat pipe. The second heating member 38 is introduced into the crystal chamber 32 by placing the heating member on top of a spacer 44 which rests on a refractory metal plate 46 extending from the base 48 of the crystal chamber wall. The second heating member 38 is located at a desired position within the crystal chamber 32 by using a spacer 44 of an appropriate length to support the heating member. The spacer is composed of graphite or any heat resistant material which would not contaminant the crystal pulling apparatus. The second heating member 38 can rest directly upon the metal plate 46 if the heating member is to be positioned at the base of the crystal chamber 32.

Figure 2:
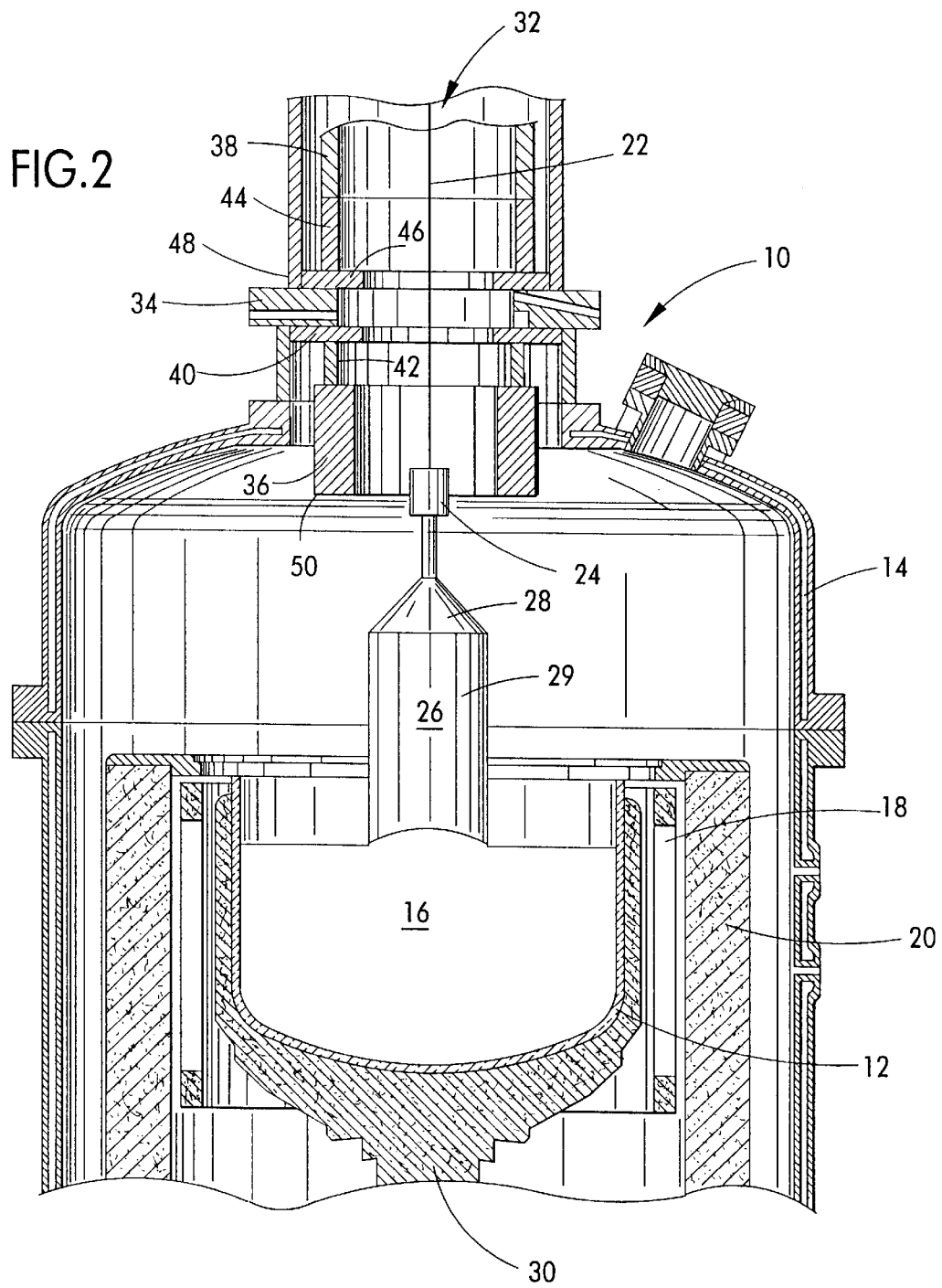

In an alternative embodiment shown in FIG. 2, the crystal chamber 32 is modified such that the gate valve 34 is within the crystal chamber. The first heating member 36 is positioned partially within the crystal chamber. Such a configuration can be used when the portion of the growth chamber above the crucible 12 is shorter than that of a conventional crystal pulling apparatus. The apparatus is assembled as described above for FIG. 1.

The crystal pulling apparatus of the present invention is used to prevent formation of oxygen precipitate nucleation centers in a silicon single crystal while the crystal is in the growth chamber, and to prevent, minimize or control the density of such nucleation centers in the crystal while it is in the crystal chamber. As a solidified segment of the crystal is pulled away from the silicon melt, its temperature decreases. Before the crystal temperature reaches about 750° C., the crystal is heated by the first heating member 36. The solidified silicon is maintained at a temperature not less than about 750° C. while the crystal passes through the first heating member as it continues to be pulled from the melt. By maintaining the solidified silicon at a temperature above about 750° C. before cooling rapidly to room temperature, nucleation centers do not form in the crystal while it is pulled through the growth chamber.

In the apparatus of FIG. 1, a crystal temperature of at least about 750° C. is maintained within the growth chamber. However, when the growth chamber is shorter than a conventional growth chamber as shown in FIG. 2, such a crystal temperature is maintained by positioning the first heating member partially within the crystal chamber. The optimal position of the first heating member is determined by measuring the crystal temperature profile within the growth chamber.

The first heating member 36 maintains the crystal at a temperature of at least about 750° C. from the formation of the crystal at the interface until the crystal is pulled above the passageway of the first heating member. Any heating element which can maintain a crystal temperature of at least about 750° C. can be used as the first heating member. Representative heating members include heat pipes, and electric heaters, heat reflecting shields and heat reflecting tubes which are well known in the art. A heat pipe is preferred as the first heating member because it acts as a heat sink, transferring heat from the lower hot crystal section to the upper section to allow for an increased crystal pull rate, thereby significantly improving the throughput of silicon ingots. When the first heating member is a heat pipe, the base 50 of the heat pipe is positioned where the temperature of the as-grown crystal is at least about 770° C., preferably between about 770° C. and about 930° C., and, more preferably, between about 820° C. and about 880° C. to maintain the crystal within the passageway of the heat pipe at a temperature of at least about 750° C., preferably between about 750° C. and about 900° C., and, more preferably, between about 800° C. and about 850° C.

The second heating member 38 within the crystal chamber 32 is either a heat pipe or a conventional electric heater. A heat pipe is preferred when a crystal temperature of about 600° C. or less is to be maintained to control the density of oxygen precipitate nucleation centers within the crystal. The heat content of the incoming crystal segment maintains the crystal within the passageway of the heat pipe at a temperature of about 600° C. or less. If the crystal temperature must be greater than about 600° C. in order to control or eliminate the formation of nucleation centers for oxygen precipitates in the crystal chamber 32, an electric heater is needed to maintain the crystal temperature. Suitable electric heaters for purposes of the present invention include heaters which maintain a constant crystal temperature such as those commonly used in silicon device processing. Such heaters are commercially available from Thermcraft, Inc. of Winston-Salem, N.C.

Figure 3:
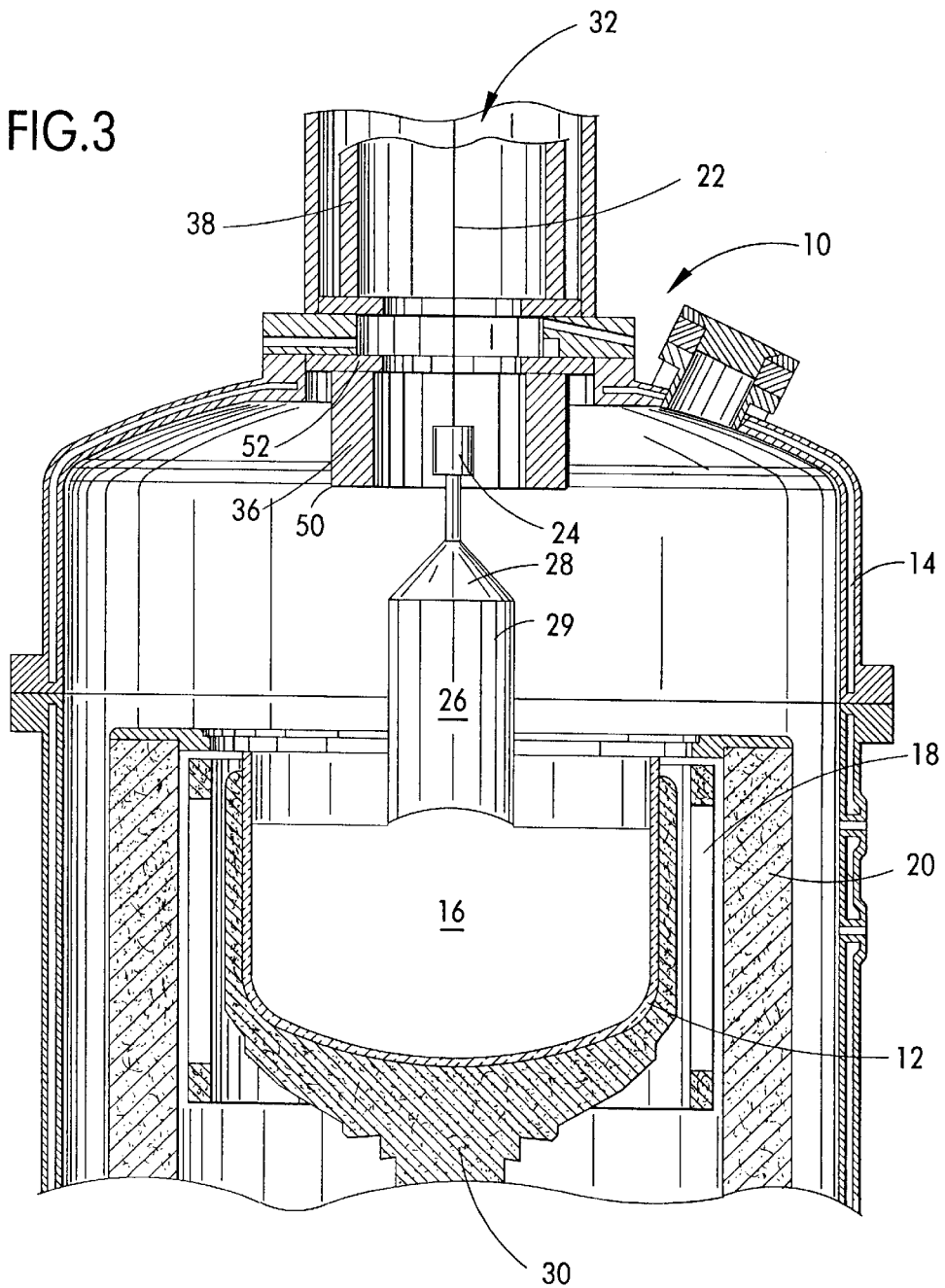
FIG. 3 is a vertical section illustrating the internal construction of a crystal pulling apparatus for producing a Czochralski-grown silicon single crystal lacking oxygen precipitate nucleation centers.

A silicon single crystal lacking oxygen precipitation nucleation centers is formed by maintaining the crystal temperature at not less than about 750° C. after the crystal is pulled above the passageway of the first heating member 36. When the crystal temperature is above 750° C. as the crystal is pulled through the passageway, the crystal is either cooled before it enters the passageway of the second heating member (FIG. 1) or pulled directly into the passageway of the second heating member without cooling (FIG. 3). In this embodiment, the second heating member is preferably a conventional electric heater operating at a temperature of at least 750° C., preferably between about 750° C. and about 900° C., more preferably between about 800° C. and about 850° C. However, other heating sources operating at temperatures in excess of 750° C. can also be used as the second heating member.

FIG. 1 illustrates a crystal 26 which is cooled to a temperature not less than about 750° C. as it exits the first heating member 36, travels through the opening of the refractory metal plate 40, the gate valve 34 and the refractory metal plate 46, and passes through the passageway of the spacer 44. The crystal is then maintained at a temperature of at least about 750° C. as it passes through the passageway of the second heating member 38. After the crystal is pulled above the second heating member 38, the crystal is rapidly quenched by the circulation of helium gas or argon at high velocity within the crystal chamber 32. The quenching procedure causes the crystal temperature to rapidly fall below about 400° C. to avoid nucleation of oxygen within the crystal.

As shown in FIG. 3, the formation of oxygen precipitation nucleation centers is also prevented by pulling the crystal 26 directly from the passageway of the first heating member 36 through the passageway of the second heating member 38. The first heating member 36 is attached directly to the bottom surface of the refractory metal plate 52. The second heating member 38 rests upon the top surface of the plate 52. The gate valve (not shown) is positioned above the second heating member in the crystal chamber 32 for providing access to the as-grown crystal. In this embodiment, the crystal essentially does not cool as it passes through the opening in the plate 52 between the first and second heating members, thereby maintaining a crystal temperature of at least about 750° C.

The formation of oxygen precipitate nucleation centers is controlled by maintaining the crystal at a temperature between about 650° C. and less than 750° C. after the crystal passes through the passageway of the first heating member 36. In order to control the density of oxygen precipitate nucleation centers within the crystal to provide some degree of internal gettering, such a crystal temperature is maintained once the entire crystal is pulled within the passageway of the second heating member 38, uniformly distributing the nucleation centers within the crystal. For purposes of the present invention, the oxygen precipitate nucleation centers are uniformly distributed when the density of the nucleation centers within a silicon crystal differ by not more than about 5% in the radial direction. The crystal temperature is maintained between about 650° C. and less than 750° C. by an electric heater or other heat source positioned within the crystal chamber 32 where the crystal temperature is at least 650° C. As the crystal is pulled above the second heating member, the crystal is rapidly quenched in helium or argon within the crystal chamber to rapidly reduce the crystal temperature below about 400° C.

If a greater density of oxygen precipitate nucleation centers is needed in the crystal for internal gettering, the entire crystal is maintained at a temperature between about 470° C. and about 650° C., preferably between about 470° C. and about 550° C., while the crystal is within the passageway of the second heating member 38 to uniformly distribute the nucleation centers. The crystal is then rapidly quenched in helium gas or air within the crystal chamber to rapidly reduce the crystal temperature below about 400° C. In order to uniformly form nucleation centers within a crystal, the crystal temperature is maintained by a heat pipe, electric heater or other heat source positioned within the crystal chamber 32. The second heating member is preferably a heat pipe because the heat pipe maintains the crystal at a more uniform temperature along its length as compared to an electric heater. The base of the heat pipe is located where the crystal temperature is between about 490° C. and about 680° C. to provide a crystal temperature of between about 470° C. and about 650° C. If a heater is used, the heater is operated at a temperature between about 470° C. and about 650° C.

In any of the above described embodiments of the invention, uniform distribution of nucleation centers within the whole silicon crystal is achieved by maintaining the entire crystal including the tail end of the crystal in the passageway of the second heating member. When the whole crystal is pulled inside the second heating member, crystal pulling is stopped. The whole crystal equilibrates to and is maintained at the temperature of the second heating member for about two to about three hours, and nucleation centers form in the whole crystal. After the dwell time, crystal pulling is resumed and the whole crystal is rapidly cooled below 400° C. The dwell time can be maintained for more than three hours if a greater oxygen precipitate nucleation center density is desired. However, if no oxygen precipitate nucleation centers are formed in the crystal, the entire crystal is maintained at a temperature above about 750° C. as it is pulled through the second heating member and the dwell time is insignificant.

A heat pipe provides a region in which the as-grown crystal is maintained at a substantially isothermal temperature as it is pulled from the silicon melt. For purposes of the present invention, a "substantially isothermal" temperature is maintained when the temperature of the bottom wall or base of the heat pipe is not more than about 10° C. higher than the temperature of the top wall of the heat pipe.

The heat pipe is a passive device which transfers heat by the evaporation and condensation of a working fluid, such as liquid metals including sodium and potassium. A heat pipe generally has a top wall, a bottom wall, an inner wall and an outer wall defining a passageway containing a porous wick structure saturated with the working fluid. Heat from the as-grown crystal is taken into the heat pipe by an evaporator which causes the fluid to vaporize, creating a pressure gradient within the heat pipe. The pressure gradient forces the vapor to flow along the pipe to a cooler section where it condenses, giving up its latent heat of vaporization. The fluid then returns to the evaporator by gravity or by capillary forces developed in the wick structure. Such heat transfer maintains the crystal at a substantially isothermal temperature as it is pulled through the passageway of the heat pipe. The operating temperature of the heat pipe is between about 20° C. and about 30° C. above the crystal temperature. The heat pipe has an inner radius which is between about 7 millimeters and about 13 millimeters, preferably about 10 millimeters, greater than the radius of the as-grown crystal. For example, a heat pipe having an inner diameter between about 214 and 226 millimeters is used for a 200 mm diameter as-grown crystal. The length of the heat pipe is determined by the axial temperature profile along the length of the crystal and is generally approximately the same size as the diameter of the crystal but can be longer. Heat pipes for use in the present invention are commercially available from Thermacore Inc. of Lancaster, Pa. and DynaTherm Corporation of Cockeysville, Md.

Silicon crystal pull rates will vary depending upon the stage of crystal growth and the desired diameter of the crystal, and the hot-zone design. Before steady state is achieved, the pull rate is about 1.4 mm/min. Upon reaching steady state, the crystal is pulled at a rate of about 0.4 mm/min to about 1.0 mm/min, preferably about 0.5 mm/min to about 0.6 mm/min, for a crystal having a 200 mm diameter. Pull rates used in typical crystal pulling methods can be used for purposes of the present invention. When a heat pipe is used as the first heating member, such typical pull rates can be increased by up to 10% for purposes of the present invention.

The methods of the present invention will control the formation of nucleation centers for oxygen precipitates in silicon having any crystal orientation including silicon the majority of silicon used in producing silicon wafers has this orientation.

While the invention is susceptible to various modifications and alternative forms, specific embodiments thereof have been shown by way of example in the drawings and are herein described in detail. It should be understood, however, that it is not intended to limit the invention to the particular form disclosed, but on the contrary, the intention is to cover all modifications, equivalents and alternatives falling within the spirit and scope of the invention as defined by the appended claims.

We claim:

1. An apparatus for producing a silicon single crystal grown by a Czochralski process, the apparatus comprising:

a hollow growth chamber;

a quartz crucible disposed within the growth chamber;

means for pulling a growing silicon single crystal upward from a silicon melt retained in the crucible;

a crystal chamber above the growth chamber for receiving the crystal as it is pulled;

means for joining the growth chamber and the crystal chamber;

a first heating member defining a passageway through which the crystal is pulled for preventing formation of oxygen precipitate nucleation centers in the crystal until the crystal has been pulled through the passageway, the first heating member being disposed at least partially within the growth chamber; and a second heating member defining a passageway through which the crystal is pulled for controlling the formation of the oxygen precipitate nucleation centers in the crystal, the second heating member being disposed within the crystal chamber.

2. The apparatus of claim 1 wherein the first heating member is an electric heater, a heat reflecting shield or tube, or a heat pipe.

3. The apparatus of claim 2 wherein the second heating member is an electric heater or a heat pipe.

4. The apparatus of claim 3 wherein the second heating member is a heat pipe having a bottom wall disposed at a position in the crystal chamber wherein the crystal temperature is not greater than about 630° C. to maintain the crystal at a temperature not greater than about 600° C. as it is pulled through the passageway of the heat pipe.

5. The apparatus of claim 4 wherein the heat pipe maintains the crystal at a substantially isothermal temperature as it is pulled through the passageway of the heat pipe.

6. The apparatus of claim 3 wherein the second heating member is an electric heater which is disposed at a position in the crystal chamber wherein the crystal temperature is between about 400° C. and about 750° C. to maintain the crystal temperature as the crystal is pulled through the passageway of the heater.

7. The apparatus of claim 6 wherein the electric heater maintains the crystal temperature at not less than about 650° C. as the crystal is pulled through the passageway of the heater, reducing the formation of the oxygen precipitate nucleation centers in the crystal.

8. The apparatus of claim 2 wherein the first heating member is a heat pipe, a bottom wall of the heat pipe being disposed at a position in the growth chamber wherein the crystal temperature is between about 770° C. and about 930° C. to maintain the crystal at a temperature between about 750° C. and about 900° C. as it is pulled through the passageway of the heat pipe.

9. The apparatus of claim 8 wherein a top wall of the heat pipe is disposed at a position in the crystal chamber.

10. The apparatus of claim 8 wherein the second heating member is an electric heater which is disposed at a position in the crystal chamber wherein the crystal temperature in the absence of the heater is at least about 750° C. to maintain the crystal temperature as it is pulled through the passageway of the heater, preventing the formation of the oxygen precipitate nucleation centers within the crystal.

11. The apparatus of claim 8 wherein the heat pipe maintains the crystal at a substantially isothermal temperature as it is pulled through the passageway of the heat pipe.

12. An apparatus for producing a silicon single crystal having a diameter and being grown by a Czochralski process, the apparatus comprising:

a hollow growth chamber;

a quartz crucible disposed within the growth chamber;

means for pulling a growing silicon single crystal upward from a silicon melt retained in the crucible;

a crystal chamber above the growth chamber for receiving the crystal as it is pulled;

means for joining the growth chamber and the crystal chamber;

a first heating member selected from the group consisting of a heat pipe and a heat reflecting tube or shield, the first heating member having an inner diameter and defining a passageway through which the crystal is pulled for preventing formation of oxygen precipitate nucleation centers in the crystal until the crystal has been pulled through the passageway, the first heating member being disposed at least partially within the growth chamber; and a second heating member defining a passageway through which the crystal is pulled for controlling the formation of the oxygen precipitate nucleation centers in the crystal, the second heating member being disposed within the crystal chamber.

13. An apparatus as set forth in claim 12 wherein the first heating member is a heat pipe.

14. An apparatus as set forth in claim 13 wherein the inner diameter of the heat pipe is between about 14 millimeters and about 26 millimeters greater than the diameter of the crystal.

15. An apparatus as set forth in claim 13 wherein the inner diameter of the heat pipe is about 20 millimeters greater than the diameter of the crystal.

16. An apparatus as set forth in claim 13 wherein the inner diameter of the heat pipe is between about 214 millimeters and about 226 millimeters.

17. An apparatus as set forth in claim 13 wherein the heat pipe maintains the crystal at a substantially isothermal temperature as it is pulled through the passageway of the heat pipe.

* * * * *